METHOD FOR FORMING A FIELD EFFECT DEVICE

Filed March 5, 1971

CHARLES H. FA
CLARENCE K. SUZUKI
INVENTOR.

BY Spensley, Horn & Lubitz
ATTORNEYS

United States Patent Office 3,690,968
Patented Sept. 12, 1972

3,690,968
METHOD FOR FORMING A FIELD EFFECT DEVICE

Charles H. Fa, Santa Clara, and Clarence K. Suzuki, San Jose, Calif., assignors to Advanced Memory Systems, Inc., Sunnyvale, Calif.

Filed Mar. 5, 1971, Ser. No. 121,259
Int. Cl. H01l 7/36
U.S. Cl. 148—188 37 Claims

ABSTRACT OF THE DISCLOSURE

A method for fabricating semiconductor devices by means of certain in-situ and encapsulating operations thus minimizing or desensitizing the environmental contaminants. The invented process when used to produce insulated gate field effect transistors produces improved process yields and devices with improved electrical characteristics.

BACKGROUND OF THE INVENTION

(I) Field of the invention

The invention relates generally to the field of semiconductor device fabrication and more specifically to certain integrated circuits utilizing insulated gate field effect transistors (hereinafter referred to as IGFET's).

(II) Description of the prior art

A typical silicon IGFET is also known and often referred to as a MOS (metal-oxide-semiconductor) or MIS (metal-insulator-semiconductor) field effect transistor. These devices are comprised of diffused source and drain regions embodied in a silicon substrate with a metal field plate overlaid above a gate insulator which has been previously disposed on the substrate surface over the channel region between the source and drain.

One version of such devices commonly used in present day digital circuits is called the P-channel enhancement device. This latter device has P-type diffused regions in a N-type silicon substrate, a thermally grown silicon dioxide (or oxide)/nitride gate insulator, and an aluminum gate electrode. When a negative potential with sufficient amplitude is applied over the gate a P-type conductive channel beneath the gate is created between the source and drain. This P-type channel structure will be used by way of example to illustrate the advantages of the invented method. However, it should be understood that the invention itself is not limited to P-channel nor to silicon devices only. N-channel devices and semiconductive materials such as germanium and gallium-arsenide are also contemplated by the present invention.

Prior art fabrication methods for the typical MOS or MIS field effect transistors involve a number of discrete processing steps including elaborate cleaning procedures. It is inherent in the discrete steps of the prior art to induce environmental contamination on the devices. Prior art methods typically require diffusion of P-type impurity through oxide masked patterns; removal of oxide in the gate region; regrowth of gate oxide; masking and etching of contacts; and, metallization. In each of the previously mentioned steps high temperatures or wet chemical treatments are normally utilized and the semiconductor wafers are thus exposed to undesirable ionic species and moisture. Consequently, the device characteristics are often degraded to the extent that poor process yields and poor device performance are obtained.

Some attempts have been made in the past to reduce surface instability in certain semiconductor devices by performing certain preoxidation cleaning, oxidation and post-oxidation annealing in-situ. However, it is believed that these in-situ operations have not been previously used to solve the specific problems inherent in forming an IGFET (e.g., forming the gate insulator and gate electrode in-situ to avoid contamination, and to improve device characteristics, etc.).

The prior art has utilized doped silicon oxide coatings (e.g., borosilicate glass) as a source of dopant for diffusions. However, it is believed that doped oxide coatings have not been used as diffusion sources in combination with the in-situ operations and encapsulations steps disclosed by the present invention for forming IGFET's.

BRIEF SUMMARY OF THE INVENTION

The present invention involves in part the forming of an IGFET by the in-situ operations of cleaning or growing channel material, depositing a gate insulator and then encapsulating the critical gate region prior to the source and drain diffusions. By using the invented method, no elaborate cleaning or special care is required during the subsequent processing steps required to make a completed IGFET. The invented method also minimizes environmental contamination and thus improves device characteristics and process yield and simplifies fabrication. The preferred method teaches the formation of $SiO_2$—$Si_3N_4$ gate insulator, a borosilicate layer as a diffusant source and a polycrystalline silicon (or molybdenum) gate electrode.

The invented method also teaches cleaning or regrowing a semiconductor substrate, depositing a gate insulator and the gate electrodes in-situ combined with other fabrication steps. Prior to the in-situ operations, the starting material or substrate is processed to deposit a low temperature field oxide layer which is then etched in the desired source/drain; channel regions by known techniques.

With the in-situ operations, described above, the critical gate region is freshly formed and tightly encapsulated and no elaborate cleaning or special care is required for the subsequent processing steps. Because of these features, the background surfaces or regions outside the gate region (active device), may be less clean and for reasons to be described later, give the desired higher field inversion. This high field inversion will in turn reduce the unwanted parasitic conductions in the background or outside the active device region.

After the in-situ operations, described above, patterns of the gate and of silicon conductors are formed by removing the deposited materials outside these regions by standard masking and etching techniques. Then a layer of borosilicate glass or a spun-on diffusant containing an opposite impurity of the substrate is deposited for the diffusion of source and drain regions and diffused conductors. Another undoped oxide layer is then deposited to encapsulate the diffusant film and to increase the field oxide thickness. The structure thus formed is then subjected to proper temperature conditions to allow the diffusant from the borosilicate glass, or the like, to diffuse into the substrate to form the source and drain and diffused conductor areas desired and to allow the field oxide to densify. Standard techniques may then be used to remove the oxides from the desired contact areas and to form the required conductive metal paths.

The invented method also allows closer dimensional control in processing than can be achieved with the prior art methods which require more discrete operations, more handling, and utilize other techniques of diffusion. Also, the gate electrode has little overlap over the source and drain regions when the in-situ operations of the present invention are utilized. In addition a wider range of starting materials can be used since the invented method allows for the easy growth of a new layer of semiconductor material prior to the gate insulator deposition. The invented method results in a shorter processing cycle and does not require elaborate cleaning procedures, special care and/or expensive processing equipment. Other advantages will be discussed or will become apparent in the following description of a preferred method utilizing the present invention. Although the examples are directed at IGFET's the invented method which results in desensitizing the environmental contamination is also useful and applicable to the fabrication of other types of semiconductor devices where similar problems are present.

BRIEF DESCRIPTION OF THE DRAWINGS

FIG. 3 is a cross-sectional view showing the source/drain/channel region of FIG. 2 after the in-situ formation of the gate insulator and gate electrode;

FIG. 4 is a cross-sectional view showing the wafer of FIG. 3 after the gate pattern is formed;

FIG. 5 is a cross-sectional view showing the wafer of FIG. 4 after a doped glass layer is deposited to form the source/drain diffusant pattern;

FIG. 6 is a top view of the wafer at the same stage of the method as shown in FIG. 5; and FIG. 7 is a cross-sectional view of the active device region shown in FIG. 5 and FIG. 6 after the deposition of another field oxide layer and after the source and drain diffusion has been accomplished.

DESCRIPTION OF THE PREFERRED METHOD

By way of example, a preferred method utilizing the invention will now be described in detail. While certain constituents, materials, techniques, temperatures and procedures are described in detail to illustrate the advantages of the present invention, it should be understood that various other constituents, materials, techniques, temperatures and procedures which will be apparent or known to those skilled in the art can be utilized without departing from the scope of this invention. The preferred method described herein has yielded excellent results for fabricating IGFET's.

Figure 1:
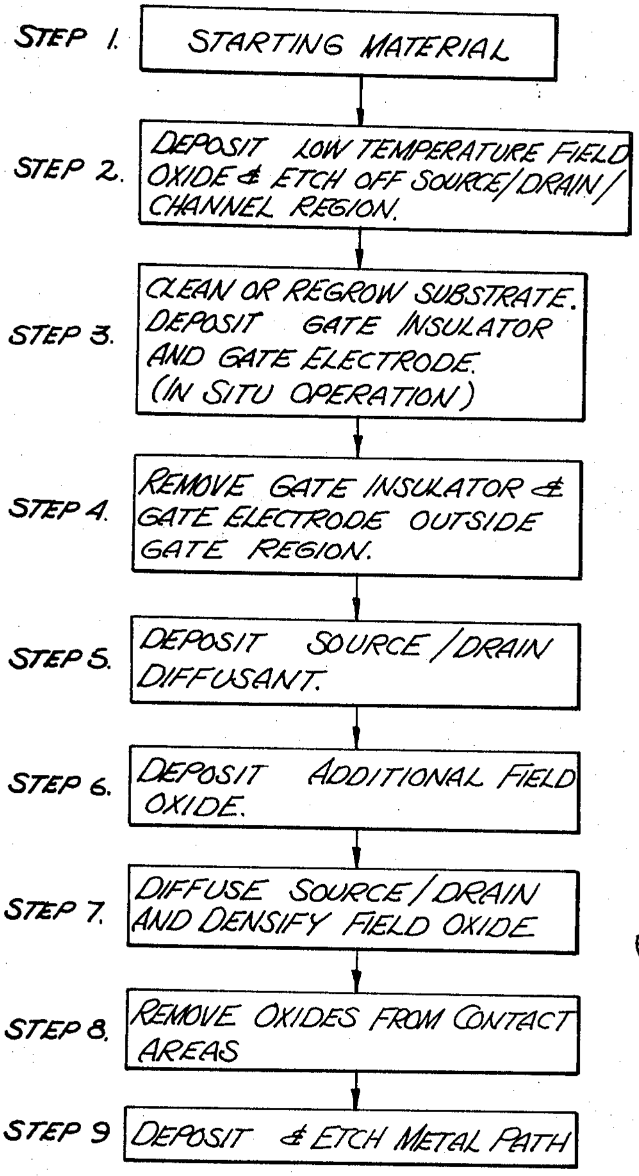
FIG. 1 is a process flow diagram showing the steps of fabricating a completed IGFET by the invented method.
Figure 2:
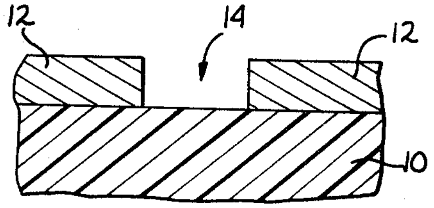
FIG. 2 is a cross-sectional view showing a wafer after a field oxide layer has been applied and a source/drain/channel on the active device region has been opened in the field oxide layer.

FIG. 1 illustrates the invented method for fabricating an IGFET in flow diagram form. The various steps shown in FIG. 1 will be discussed in conjunction with FIGS. 2–7 which show the pertinent portions of a wafer as it proceeds through various steps of the invented method.

A starting semiconductor material or substrate 10, such as, a chemically-mechanically polished N-type silicon wafer of about 3 to 5 ohm-cm., is provided. (Step 1 of FIG. 1.) If desired, the starting material 10 may have a wider resistivity range than that mentioned, such as the relatively low cost N+ substrate material, since an epitaxial layer of the desired resistivity can be easily deposited as will be described in greater detail hereinbelow.

A layer 12 consisting of a low temperature field oxide (e.g., $SiO_2$) of approximately 8,000 to 10,000 A. is first deposited in conventional vapor deposition equipment with a mixture of $SiH_4$ and $O_2$ in a $N_2$ rich ambient at approximately 350–450° C. The predeposition cleaning of the substrate or wafer is not critical because the active device region will go through separate cleaning or epitaxial growth operations as described hereinafter. The low temperature oxide layer 12 in the active region 14 is etched off by conventional photoresist techniques which are well known in the art. (See FIG. 2.) The deposition of the field oxide layer 12 and etching the active region 14 constitutes Step 2 of FIG. 1. The active region 14 corresponds to the source/drain/channel region which will be formed using the invented process.

If desired, a fresh N-type epitaxial layer (not shown) of about 3 to 5 ohm-cm. can be deposited on the substrate 10 in the area 14 after a suitable cleaning. This may be desirable where, for example, a low cost N+ substrate having a resistivity outside of the range of 3 to 5 ohm-cm. is used as a starting material. If an epitaxial layer is deposited, it is done in an epitaxial reactor and the layer should be approximately 5 $\mu$m. thick. The epitaxial layer may be formed in the reactor using the conventional reduction of $SiCl_4$ or $SiH_4$.

If no epitaxial silicon growth is required, the wafers are simply cleaned at an elevated temperature (1100–1200° C.) in the reactor by the well known HCl vapor etch. This is the same cleaning procedure generally used to clean the active area 14 prior to the epitaxial silicon deposion discussed above.

Upon completion of the epitaxial growth or the cleaning cycle, an oxide layer 16 (e.g., $SiO_2$) of approximately 1000 A. is deposited with a very dilute mixture of $SiH_4$ and $O_2$ in a large amount of nitrogen (at ~800–1000° C. for ~5 min.). Alternatively, the gate oxide can be formed either with $SiH_4$ reacting with $CO_2$ in hydrogen or by the thermal oxidation of silicon with dry $O_2$ in the temperature range of about 900–1100° C. An annealing cycle is then applied at ~900–1100° C. for ~15 min. with nitrogen or helium flowing at ~1000–2000 cc./min., this is followed by a consecutive deposition of a $Si_3N_4$ layer 18 of approximately 500 A., a polycrystalline silicon layer 20 of approximately 1 $\mu$m, and another oxide layer 22 of (e.g., $SiO_2$) approximately 3000 A. The $Si_3N_4$ layer 18 may be deposited at ~800° C. using a dilute mixture of $SiH_4$ in nitrogen for 1 minute as detailed in the co-pending patent application Ser. No. 28,966 now abandoned. The deposition conditions for producing the polycrystalline silicon layer 20 are substantially identical to those previously described above for deposition of the $Si_3N_4$ layer. The deposition conditions for producing the oxide layer 22 are substantially identical to those previously described above for depositing the oxide layer 16.

Figure 3:
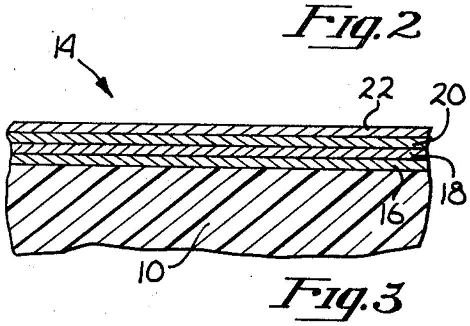
FIGS. 3–7 show the cross-section of this active device region after subsequent fabrication steps.

It should be understood that one of the main advantages of the present invention resides in the in situ operation (Step 3 of FIG. 1) which takes place in the reactor operations of either cleaning or epitaxially regrowing the substrate in active area 14; depositing the gate insulator materials (oxide and $Si_3N_4$ layers) and depositing the gate electrode (polycrystalline silicon) material. The reactor utilized for the in-situ operations is typically a conventional RF heated chamber. The structure of the active wafer area 14 upon completion of these in-situ operations is shown in FIG. 3. The in-situ operations discussed above help in avoiding the environmental contamination normally encountered by handling and/or exposing the wafer to ambient conditions after the various operations are performed for depositing the gate insulating and electrode materials.

Figure 4:
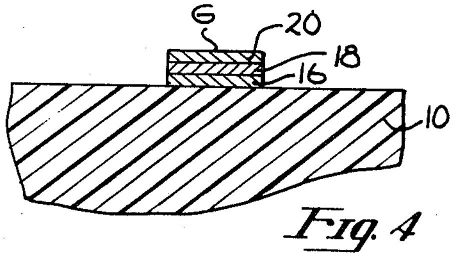

Conventional photolithographic techniques are then used to etch off the in-situ deposits outside the gate region G (see FIG. 4). Briefly, KMER (Kodak Metal-Etch Resist, manufactured by Eastman Kodak Company, Rochester, N.Y.) is used to mask a buffered HF etch for the top oxide layer 22, the top oxide 22 serves as the mask for a silicon etchant (e.g., 1:9 HF:$HNO_3$ by volume) and the silicon layer 20 is used as a mask to etch the $Si_3N_4$ layer 18 with concentrated HF or $H_3PO_4$. Also, first level interconnection patterns for silicon conductors can be etched at the same time using photolithographic techniques. This forming of gat region G corresponds to Step 4 of FIG. 1.

Figure 5:
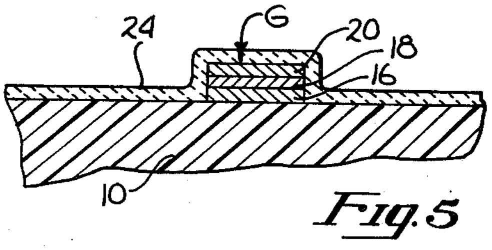
Figure 6:
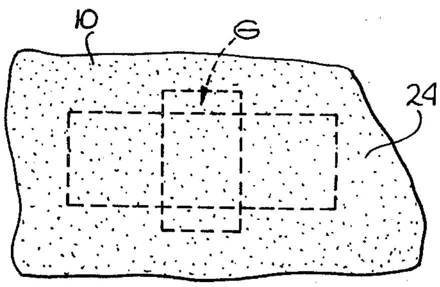

Any residual oxide in the source and drain areas is then removed and a layer of borosilicate glass 24 of approximately 2000 A. is deposited over the wafers by means of low temperature vapor deposition equipment at ~400° C. with a mixture containing approximately 0.1–0.2 mole percent $B_2H_6$, <1.0 mole percent $SiH_4$, and 3–10 mole percent $O_2$, all in nitrogen. A flow rate of about 5–35 l./min. has been found to yield excellent results. FIGS. 5 and 6 show the borosilicate layer 24 and the desired source/drain and gate areas. The dotted lines in FIG. 6 indicate the source/drain and gate areas under the layer 24.

Another undoped layer 26 of field oxide (e.g., $SiO_2$) of approximately 10,000 to 15,000 A. is deposited over the wafer in the same low temperature vapor deposition equipment with a mixture of <1 mole percent $SiH_4$ and 3–10 mole percent $O_2$ in nitrogen and at the same conditions described for layer 12. (Step 6 of FIG. 1.)

Figure 7:
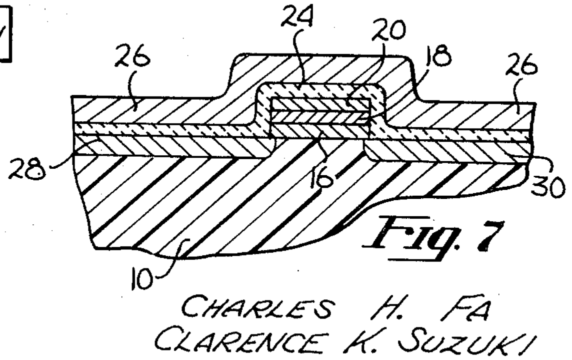

The wafers are then placed in a conventional diffusion furnace or equivalent high temperature equipment for diffusing the source/drain junctions 28 and 30, respectively, and for densifying the deposited glass. (Step 7 of FIG. 1.) The dopant contained in the borosilicate layer 24 is diffused into the substrate 10 or the regrown portion of the substrate, if an epitaxial layer is used. The forming of the source/drain junctions 28 and 30 is conventional. Due to the unique nature of the structure obtained by the invented method (see FIG. 7), the diffusion temperature can be made relatively low, e.g., about 800–1100° C., and the diffusion ambient is not critical. The basic structure of the IGFET is essentially completed at this stage as depicted in FIG. 7. Susequent operations shown in Steps 8 and 9 of FIG. 1 consists of opening of contact holes, metal deposition and metal etching with commonly used conventional fabrication techniques, which do not per se form a part of the present invention.

Certain modifications to the above described preferred method can be made. For example, borosilicate glass layer 24 was proposed as the diffusion source. A spun-on diffusant such as commercially available Emulsitone solutions (siloxane monomers in ethyl alcohol solutions manufactured by Emulsitone Co. of Livingston, N.J.) were also found to be satisfactory. Both P-type and N-type diffusion solutions and undoped $SiO_2$ solutions are available. The diffusant solution is first spun-on with a conventional photoresist spinner an undoped Emulsitone solution or a low temperature oxide is then deposited in similar manner as described above to form layer 26. On exposure to air or during baking, the organic portion of the dopant is driven out allowing the siloxane to hydrate and causes three dimensional cross-linking with the dopant incorporated in the gel. The dopant is generally contained in the alkane portion of the siloxane.

Also, molybdenum electrodes or other suitable electrode material can be used in place of the polycrystalline silicon 20. From a processing standpoint polycrystalline silicon is easier to grow, however, molybdenum is easier to etch. The work function difference between the electrode and the semiconductor (often referred to by the symbol $\phi_{MS}$) for polycrystalline silicon and molybdenum is different and this may affect the turn-on voltage of the device. The choice of electrode material should be consistent with the overall processing capability and device requirements. Obviously, aluminum is not used as a gate electrode because of the high temperature involved.

In addition to being used as gate electrodes, the deposited polysilicon or molybdenum film can be also utilized as conductor paths. Such silicon or molybdenum conductor patterns are etched simultaneously with the gate pattern with methods described hereinabove. In terms of the final metallized conductors, these silicon or molybdenum conductors can be considered as second level metallization.

As previously mentioned, the invented method is also applicable to N-channel devices. In general, the concept of using the in-situ cleaning and deposition to seal up the critical device area and to desensitize environmental contaminations is applicable to many semiconductor fabrications where cleanliness and stability are crucial requirements.

The present invention produces devices which have low turn-on voltage, good gate stability and high field inversion. The turn-on or threshold voltage $V_T$ of an IGFET is defined by the following equation:

$$|V_T| \approx \frac{q(N_{ss}+N_B)}{Co}$$

where $N_B$=charge density in the surface of semiconductor, a function of the substrate doping.

$N_{ss}$=charge density in the insulator at the insulator/semiconductor interface.

$Co$=capacitance per unit area of the insulator.

$q$=magnitude of electronic charge ($1.6 \times 10^{-19}$ coulomb)

$N_{ss}$ is determined by crystal orientation and process cleanliness. For a given substrate orientation, the cleaner the interface the lower the $N_{ss}$ and the $V_T$ and vice versa.

Since in the present invention there is no elaborate cleaning in the field area and a thorough cleaning is used (HCl etch, etc.) in the channel region lower $N_{ss}$ is achieved in the channel region, and consequently low turn-on voltage for the active device and high field inversion for the parasitic device are possible. A high $N_{ss}$ in the field region generally insures the desired field inversion for the parasitic device or background surfaces outside the gate region. A good gate stability is obtained because the sensitive interfaces at the channel are tightly sealed up by the in-situ deposition of $SiO_2$, $Si_3N_4$ and Si films. For example, with the N-type 1–1–1 oriented silicon substrate of 3–5 ohm-cm. it is not uncommon to have an $N_{ss}$ around $5 \times 10^{11}$ cm.$^{-2}$ with normal cleaning procedures. With the in-situ cleaning and depositiing method of this invention, one can have an $N_{ss}$ around $10^{11}$ cm.$^{-2}$. These values correspond to approximately 1.5 v. of threshold and 30 volts of field-inversion for normal oxide thicknesses. Thus, the invented process allows the creation of regions of different degrees of surface and interface cleanliness for optimum device parameters. This desired feature is unattainable with prior art methods.

The present invention also allows a great deal of freedom in starting materials.

With the proposed in-situ operation, it does not involve much extra effort or cost for growing a new layer of semiconductor material prior to the gate insulator deposition. In doing so, the doping level or resistivity of the original substrate is not critical. For example, one can use 1 to 20 ohm-cm. or even a wider spread in the starting material for depositing an epitaxial layer of 3 to 5 ohm-cm. as previously discussed.

One the gate insulator and the gate electrode are deposited, there is no need for high temperature treatment except that of a diffusion temperature around 1000° C. or lower. In the conventional method, a much higher temperature treatment is required (1100° C. or higher) for the gate oxidation. In fact, there is no high temperature involved prior to the gate formation because a low temperature deposited oxide is used as discussed hereinabove.

The invented method employs proven fabrication techniques and does not require elaborate cleaning procedures, special care or expensive processing equipment. The in-situ operations allow shorter processing cycles and reduces environmental contamination. Dimensional control, particularly for channel length and lateral diffusions and hence high component density are also achieved by the invented method. Other advantages of the invented method will be apparent to those skilled in the art.

We claim:

1. A method for fabricating an insulated gate field effect transistor device having minimized environmental contamination comprising the steps of:

(a) providing a semiconductor substrate of a given conductivity type having a first field oxide layer thereon and an opening in said first field oxide layer for forming an active device region;

(b) preparing the surface of the substrate corresponding to the opening in said first field oxide to obtain the desired resistivity and cleanliness;

(c) depositing in said opening an insulating layer in-situ following the surface preparation step;

(d) depositing over said insulating layer in said opening an electrode material layer in-situ following the deposition of said insulating layer;

(e) removing said insulating layer and said electrode material layer from all areas in said opening except the central region which forms the gate;

(f) depositing a layer containing the source/drain diffusant into said opening, said diffusant being of different conductivity type from said substrate;

(g) depositing a second field oxide layer to encapsulate said device; and (h) applying heat to cause said diffusant to diffuse into the substrate to form source and drain regions on opposite sides of said gate and to cause said second field oxide layer to densify.

2. The method of claim 1 in which first level silicon conductor interconnection patterns are formed at the same time the gate is formed.

3. The method of claim 1 in which the substrate material has the desired resistivity and the surface of said substrate in said opening is prepared by a chemical etchant to obtain the desired cleanliness.

4. The method of claim 1 in which the surface of said substrate is prepared by epitaxially growing a layer of the desired conductivity type and resistivity.

5. The method of claim 1 in which the depositing of said insulating layer comprises depositing an oxide layer followed by the depositing of a silicon nitride layer.

6. The method of claim 5 in which said oxide insulating layer is formed in-situ from a dilute mixture of $SiH_4$ and $O_2$ in nitrogen in the range of about 800–1000° C.

7. The method of claim 5 in which said oxide insulating layer is formed in-situ from $SiH_4$ reacting with $CO_2$ in hydrogen in the range of about 900–1100° C.

8. The method of claim 5 in which said oxide insulating layer is formed in-situ from thermal oxidation of silicon with dry $O_2$ in the range of about 900–1100° C.

9. The method of claim 5 in which said silicon nitride layer is formed in-situ from a dilute mixture of $SiH_4$ in nitrogen at about 800° C.

10. The method of claim 1 in which the depositing of said electrode material layer comprises depositing a polycrystalline silicon layer on said insulating layer.

11. The method of claim 1 in which the depositing of said electrode material layer comprises depositing a molybdenum layer on said insulating layer.

12. The method of claim 1 in which said source/drain diffusant is a doped glass layer.

13. The method of claim 1 in which said source/drain diffusant is a spun-on type diffusant.

14. The method of claim 1 in which the active device region is formed to be cleaner than the regions on the wafer outside the active region so that the $N_{ss}$ of the active region is lower than the regions outside the active region thereby insuring high field inversion outside the gate region.

15. A method for fabricating an insulated gate field effect transistor device having minimized environment contamination comprising the steps of:

(a) providing a semiconductor substrate of a given conductivity type and a given resistivity;

(b) depositing a first field oxide layer on at least one surface of said substrate;

(c) removing said first field oxide layer to form an opening and to uncover a selected area of said substrate for forming an active device region opening;

(d) etching said selected area chemically to obtain the desired cleanliness;

(e) depositing in said opening an insulating layer in-situ following said chemical etching;

(f) depositing over said insulating layer in said opening an electrode material layer in-situ following the deposition of said insulating layer;

(g) removing said insulating layer and said electrode material layer from all areas in said opening except the central region which forms the gate;

(h) depositing a layer containing the source/drain diffusant into said opening, said diffusant being of different conductivity type from said substrate;

(i) depositing a second field oxide layer to encapsulate said device; and (j) applying heat to cause said diffusant to diffuse into the substrate to form source and drain regions on opposite sides of said gate and to cause said second field oxide layer to densify.

16. The method of claim 15 in which first level silicon conductor interconnection patterns are formed at the same time the gate is formed.

17. The method of claim 15 in which the depositing of said insulating layer comprises depositing an oxide layer followed by the depositing of a silicon nitride layer.

18. The method of claim 17 in which said oxide insulating layer is formed in-situ from a dilute mixture of $SiH_4$ and $O_2$ in nitrogen in the range of about 800–1000° C.

19. The method of claim 17 in which said oxide insulating layer is formed in-situ from $SiH_4$ reacting with $CO_2$ in hydrogen in the range of about 900–1100° C.

20. The method of claim 17 in which said oxide insulating layer is formed in-situ from thermal oxidation of silicon with dry $O_2$ in the range of about 900–1100° C.

21. The method of claim 17 in which said silicon nitride layer is formed in-situ from a dilute mixture of $SiH_4$ in nitrogen at about 800° C.

22. The method of claim 15 in which the depositing of said electrode material layer comprises depositing a polycrystalline silicon layer on said insulating layer.

23. The method of claim 15 in which the depositing of said electrode material layer comprises depositing a molybdenum layer on said insulating layer.

24. The method of claim 15 in which said source/drain diffusant is a doped glass layer.

25. The method of claim 15 in which said source/drain diffusant is a spun-on type diffusant.

26. The method of claim 15 in which the active device region is formed to be cleaner than the regions on the wafer outside the active region so that the $N_{ss}$ of the active region is lower than the regions outside the active region thereby insuring high field inversion outside the gate region.

27. A method for fabricating an insulated gate field effect transistor device having minimized environmental contamination comprising the steps of:

(a) providing a semiconductor substrate of a given conductivity type;

(b) depositing a first field oxide layer on at least one surface of said substrate;

(c) removing said first field oxide layer to form an opening and to uncover a selected area of said substrate for forming an active device region opening;

(d) cleaning said selected area chemically to make said area suitable for epitaxial growth;

(e) epitaxially growing in-situ a layer of the desired conductivity type and resistivity;

(f) depositing in said opening an insulating layer in-situ following said chemical etching;

(g) depositing over said insulating layer in said opening an electrode material layer in-situ following the deposition of said insulating layer;

(h) removing said insulating layer and said electrode material layer from all areas in said opening except the central region which forms the gate;

(i) depositing a layer containing the source/drain diffusant into said opening, said diffusant being of different conductivity type from said substrate;

(j) depositing a second field oxide layer to encapsulate said device; and (k) applying heat to cause said diffusant to diffuse into the substarate to form source and drain regions on opposite sides of said gate and to cause said second field oxide layer to densify.

28. The method of claim 27 in which the depositing of said insulating layer comprises depositing an oxide layer followed by the depositing of an silicon nitride layer.

29. The method of claim 28 in which said oxide insulating layer is formed in-situ from a dilute mixture of $SiH_4$ and $O_2$ in nitrogen at about 800° C.

30. The method of claim 28 in which said oxide insulating layer is formed in-situ from $SiH_4$ reacting with $CO_2$ in hydrogen in the range of about 900–1100° C.

31. The method of claim 28 in which said oxide insulating layer is formed in-situ from thermal oxidation of silicon with dry $O_2$ in the range of about 900–1100° C.

32. The method of claim 28 in which said silicon nitride layer is formed in-situ from a dilute mixture of $SiH_4$ in nitrogen at about 800° C.

33. The method of claim 27 in which the depositing of said electrode material layer comprises depositing a polycrystalline silicon layer on said insulating layer.

34. The method of claim 27 in which the depositing of said electrode material layer comprises depositing a molybdenum layer on said insulating layer.

35. The method of claim 27 in which said source/drain diffusant is a doped glass layer.

36. The method of claim 27 in which said source/drain diffusant is a spun-on type diffusant.

37. The method of claim 27 in which the active device region is formed to be cleaner than the regions on the wafer outside the active region so that the $N_{ss}$ of the active region is lower than the regions outside the active region thereby insuring high field inversion outside the gate region.

References Cited

UNITED STATES PATENTS

| | | | |
|---|---|---|---|
| T887,018 | 6/1971 | Rodari | 148—187 |
| 3,475,234 | 10/1969 | Kerwin et al. | 148—187 |
| 3,514,348 | 5/1970 | Ku | 148—188 |
| 3,541,676 | 11/1970 | Brown | 317—235 B X |
| 3,544,399 | 12/1970 | Dill | 148—187 |
| 3,566,517 | 3/1971 | Brown et al. | 317—235 B X |
| 3,586,547 | 6/1971 | Glendinning et al. | 148—175 |
| 3,601,888 | 8/1971 | Engeler | 148—188 X |
| 3,608,189 | 9/1971 | Gray | 317—235 B X |
| 3,614,829 | 10/1971 | Burgess et al. | 148—188 X |

GEORGE T. OZAKI, Primary Examiner

U.S. Cl. X.R.

148—186, 187, 1.5 175; 317—235 B